US012652043B2

(12) United States Patent     (10) Patent No.:   US 12,652,043 B2

Sawada et al.          (45) Date of Patent:     Jun. 9, 2026

(54) CONTROL DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Ryohei Sawada, Yokkaichi (JP); Masaya Ina, Yokkaichi (JP); Kota Oda, Yokkaichi (JP)

(73) Assignees: AutoNetworks Technologies, Ltd., Yokkaichi (JP); Sumitomo Wiring Systemsm, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 18/706,214

(22) PCT Filed: Oct. 21, 2022

(86) PCT No.: PCT/JP2022/039204

§ 371 (c)(1),
(2) Date: Apr. 30, 2024

(87) PCT Pub. No.: WO2023/079975

PCT Pub. Date: May 11, 2023

(65) Prior Publication Data

US 2025/0015797 A1     Jan. 9, 2025

(30) Foreign Application Priority Data

Nov. 4, 2021    (JP) ................................. 2021-180489

(51) Int. Cl.
    *H02M 3/158*      (2006.01)
    *B60R 16/023*     (2006.01)
    *H03K 17/687*     (2006.01)

(52) U.S. Cl.
    CPC ..... *H03K 17/6871* (2013.01); *B60R 16/0231* (2013.01); *H02M 3/158* (2013.01)

(58) Field of Classification Search
    CPC .. H03K 17/6871; H03K 17/00; H03K 17/687; H03K 17/08; B60R 16/0231; H02M 3/158; H02H 7/20
    See application file for complete search history.

(56) References Cited

U.S. PATENT DOCUMENTS 11,742,692 B1 *   8/2023   Girvin ........................ H02J 7/90
                                                 307/66
2003/0132736 A1 *   7/2003   O'Mara ................ H02M 3/158
                                                 323/282

(Continued)

FOREIGN PATENT DOCUMENTS

AU        2016219629 A1 *   9/2016   ............. G05B 15/02
JP          2013-072681 A      4/2013

(Continued)

OTHER PUBLICATIONS

International Search Report, Application No. PCT/JP2022/039204, mailed Jan. 10, 2023. ISA/Japan Patent Office.

*Primary Examiner* — Pinping Sun

(74) *Attorney, Agent, or Firm* — Brooks Kushman P.C

(57)            ABSTRACT

In a control device for a vehicle, a first terminal is disposed downstream of a microcomputer in a current path through which a current flows through the microcomputer. The anode of a connection diode is connected to a connection node between the microcomputer and the first terminal. One end of a connection switch is connected to the cathode of the connection diode. A second terminal is connected to the other end of the connection switch. A switching circuit turns ON the connection switch from OFF when a voltage at the (Continued)

first terminal with respect to the potential of the second terminal increases to a threshold voltage or higher.

8 Claims, 8 Drawing Sheets

(56) References Cited

U.S. PATENT DOCUMENTS

| | | | |
|---|---|---|---|
| 2011/0057592 A1 | 3/2011 | Sicard | |
| 2012/0275070 A1 | 11/2012 | Sicard | |
| 2014/0143560 A1* | 5/2014 | Kwon | G09G 3/2092 |
| | | | 713/300 |
| 2014/0361790 A1* | 12/2014 | Nakanishi | G01R 31/31924 |
| | | | 324/555 |
| 2020/0244260 A1 | 7/2020 | Chisaka | |
| 2021/0281105 A1* | 9/2021 | Oda | H02J 7/855 |

FOREIGN PATENT DOCUMENTS

| | | | | |
|---|---|---|---|---|
| JP | 2014103507 A | * | 6/2014 | H03K 17/0822 |
| JP | 2017112816 A | * | 6/2017 | |
| WO | WO-0191274 A1 | * | 11/2001 | H02M 3/158 |

* cited by examiner

CONTROL DEVICE

CROSS-REFERENCE TO RELATED APPLICATIONS

This application is the U.S. national stage of PCT/JP2022/039204 filed on Oct. 21, 2022, which claims priority of Japanese Patent Application No. JP 2021-180489 filed on Nov. 4, 2021, the contents of which are incorporated herein.

TECHNICAL FIELD

The present disclosure relates to a control device.

BACKGROUND

JP 2014-103507A discloses a control device configured to control power supply from a power source to a load. This control device includes a switch in a current path through which a current flows from the power source through the load. The switch is turned ON or OFF in accordance with a signal output from an integrated circuit (IC). The IC is connected to the positive electrode of the power source and the ground terminal. The ground terminal is connected to the ground. The current flows from the positive electrode of the power source through the IC, the ground terminal, and the ground in this order. As a result, power is supplied to the IC.

In the configuration disclosed in JP 2014-103507A, if the ground terminal is disconnected from the ground, a voltage at the ground terminal with respect to the potential of the ground increases. When the voltage at the ground terminal with respect to the potential of the ground increases, the voltage applied to the IC decreases. If this voltage drop is large, the IC may not operate properly.

An object of the present disclosure is to provide a control device configured to suppress an increase in voltage at a terminal disposed downstream of a processor in a current path through which a current flows through the processor configured to execute a process.

SUMMARY

A control device according to an aspect of the present disclosure is a control device for a vehicle including: a processor configured to execute a process; a first terminal disposed downstream of the processor in a current path through which a current flows through the processor flows; a diode having an anode connected to a connection node between the processor and the first terminal; a connection switch having one end connected to a cathode of the diode; a second terminal connected to the other end of the connection switch; and a switching circuit configured to turn ON the connection switch from OFF when a voltage at the first terminal with respect to the potential of the second terminal increases to a threshold voltage or higher.

ADVANTAGEOUS EFFECTS

According to the present disclosure, in a current path through which a current flows through a processor configured to execute a process, the voltage at a terminal disposed downstream of the processor is kept from increasing.

DETAILED DESCRIPTION OF PREFERRED EMBODIMENTS

Figure 1:
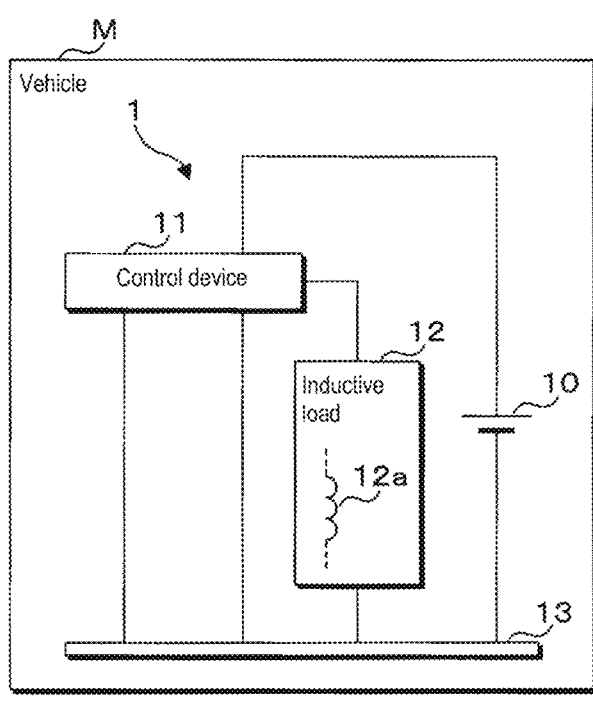
FIG. 1 is a block diagram showing a configuration of a main part of a power source system 1 according to a first embodiment.

First, embodiments of the present disclosure will be listed and described. At least some of the embodiments described below may also be combined as appropriate.

A control device according to an aspect of the present disclosure is a control device for a vehicle including: a processor configured to execute a process; a first terminal disposed downstream of the processor in a current path through which a current flows through the processor; a diode having an anode connected to a connection node between the processor and the first terminal; a connection switch having one end connected to a cathode of the diode; a second terminal connected to the other end of the connection switch; and a switching circuit configured to turn ON the connection switch from OFF when a voltage at the first terminal with respect to the potential of the second terminal increases to a threshold voltage or higher.

In the above aspect, the first terminal and the second terminal are connected to the same conductor. The current flows through the processor, the first terminal, and the conductor in this order, and as a result, power is supplied to the processor. When the first terminal is disconnected from the conductor, for example, a voltage at the first terminal with respect to the potential of the second terminal increases. If the voltage at the first terminal with respect to the potential of the second terminal increases to the threshold voltage or higher, the switching circuit turns ON the connection switch. When the connection switch is ON, a current flows through the processor, the diode, the connection switch, the second terminal, and the conductor in this order.

In this case, the voltage at the first terminal with respect to the potential of the second terminal is a forward voltage. Therefore, even when the voltage at the first terminal with respect to the potential of the second terminal increases, the voltage at the first terminal with respect to the potential of the second terminal does not exceed the larger voltage of the threshold voltage and the forward voltage, and thus the voltage at the first terminal is kept from increasing.

The control device according to an aspect of the present disclosure may further include a power supply switch disposed in a power supply path from a DC power source to a load, and the processor may be configured to instruct the power supply switch to be turned ON or OFF.

In the above aspect, the processor controls the power supply from the DC power source to the load by instructing the power supply switch to be turned ON or OFF.

The control device according to the aspect of the present disclosure may further include a first board on which the processor is disposed, and a second board that is different from the first board and on which the power supply switch is disposed.

In the above aspect, the processor is disposed on the first board and the power supply switch is disposed on the second board. With this configuration, by changing the second board, the power supply switch can be changed without changing the processor.

The control device according to the aspect of the present disclosure may further include a second diode having a cathode connected to a connection node between the power supply switch and the load, and a second connection-switch connected between an anode of the second diode and the second terminal, and the load may include an inductor.

In the above aspect, energy is stored in the inductor of the load while power is supplied to the load. When the second connection-switch is ON with the second terminal and the one end of the load being connected to the conductor, a current flows from the one end of the load to the conductor, the second terminal, the second connection-switch, the second diode, and the other end of the load in this order. As a result, the energy stored in the inductor is released.

In the control device according to the aspect of the present disclosure, the processor may be configured to instruct the second connection-switch to be turned ON when instructing the power supply switch to be turned ON, and may instruct the second connection-switch to be turned OFF when instructing the power supply switch to be turned OFF.

In the above aspect, when the power supply switch is ON and the second connection-switch is OFF with the second terminal and the one end of the load being connected to the conductor, power is supplied from the DC power source through the load via the power supply switch. As a result, energy is stored in the inductor of the load. In contrast, when the power supply switch is turned OFF and the second connection-switch is turned OFF, the energy stored in the inductor is released.

The control device according to the aspect of the present disclosure may further include a regulator configured to step down a power source voltage of a DC power source with respect to the potential of the first terminal to a target voltage and apply the target voltage to the processor, and the switching circuit may be configured to turn ON the connection switch from OFF with the power source voltage being the target voltage or higher.

In the above aspect, the switching circuit turns ON the connection switch from OFF before the power source voltage with respect to the potential of the first terminal decreases to lower than the target voltage. With this configuration, even when the voltage at the first terminal with respect to the potential of the second terminal increases, the regulator continues to apply the target voltage to the processor.

The control device according to the aspect of the present disclosure may further include a resistor having one end connected to the second terminal, wherein the connection switch may include a control terminal, the other end of the resistor may be connected to the control terminal of the connection switch, the connection switch may be turned ON from OFF when a voltage at the control terminal with respect to the potential of the second terminal increases to a predetermined voltage or higher, the switching circuit may include a circuit switch having an input terminal to which a current is input and an output terminal from which a current is output, the output terminal of the circuit switch may be connected to control terminal of the connection switch, a circuit voltage may be applied to the input terminal of the circuit switch, and the circuit switch may be turned ON from OFF when a voltage at the first terminal with respect to the potential of the second terminal increases to the threshold voltage or higher.

In the above aspect, when a voltage at the first terminal with respect to the potential of the second terminal increases to the threshold voltage or higher, the circuit switch is turned ON from OFF. When the circuit switch is ON, a current flows through the circuit switch, the resistor, and the second terminal in this order. This results in a voltage drop across the resistor. As a result, a voltage at the control terminal with respect to the potential of the second terminal increases to the predetermined voltage or higher, and the connection switch is turned ON from OFF. In the control device according to the aspect of the present disclosure, the circuit switch may include a second control terminal, the circuit switch may be turned ON when a voltage at the second control terminal with respect to the potential of the input terminal is a second predetermined voltage or lower, the switching circuit may include a circuit resistor connected between the input terminal of the circuit switch and the second control terminal, and a second circuit-switch connected between the second control terminal and the second terminal of the circuit switch, and the second circuit-switch may be turned ON from OFF when a voltage at the first terminal with respect to the potential of the second terminal increases to the threshold voltage or higher.

In the above aspect, when the voltage of the first terminal with respect to the potential of the second terminal increases to the threshold voltage or higher, the second circuit-switch is turned ON from OFF. When the second circuit-switch is ON, a current flows through the circuit resistor, the second circuit-switch, and the second terminal in this order, and as a result, a voltage drop occurs in the circuit resistor. As a result, the voltage at the second control terminal with respect to the potential of the input terminal decreases to the second predetermined voltage or lower, and the circuit switch is turned ON.

The control device according to the aspect of the present disclosure may further include a voltage detection circuit configured to detect a power source voltage of the DC power source with respect to the potential of the first terminal, wherein the switching circuit may be configured to turn ON the connection switch from OFF when the voltage at the first terminal with respect to the potential of the second terminal increases to the threshold voltage or higher with the power source voltage detected by the voltage detection circuit being lower than a third predetermined voltage.

In the above aspect, when a voltage at the first terminal with respect to the potential of the second terminal increases, the power source voltage with respect to the potential of the first terminal decreases. In addition, when the voltage at the first terminal with respect to the potential of the second terminal increases to the threshold voltage or higher with the power source voltage with respect to the potential of the first terminal being the third predetermined voltage or lower, the connection switch is turned ON from OFF. Therefore, when the voltage at the first terminal is highly likely to have increased, the connection switch is turned ON from OFF.

A specific example of a power source system according to embodiments of the present disclosure will be described below with reference to the drawings. The present disclosure is not limited to the following examples, but rather is defined by the claims, and all changes that come within the meaning and range of equivalency of the claims are intended to be embraced therein.

First Embodiment

Configuration of Power Source System

FIG. 1 is a block diagram showing a configuration of a main part of a power source system 1 according to a first embodiment. The power source system 1 is installed in a vehicle M. The power source system 1 includes a direct-current (DC) power source 10, a control device 11, an inductive load 12, and a grounding conductor 13. The DC power source 10 is a battery, for example. The inductive load 12 has an inductor 12a, and is a motor, for example. The grounding conductor 13 is a body of the vehicle M, for example. The power source system 1 is grounded by being connected to the grounding conductor 13.

The positive electrode of the DC power source 10 is connected to the control device 11. The control device 11 is further connected to one end of the inductive load 12 and the grounding conductor 13. The other end of the inductive load 12 and the negative electrode of the DC power source 10 are connected to the grounding conductor 13.

Figure 2:
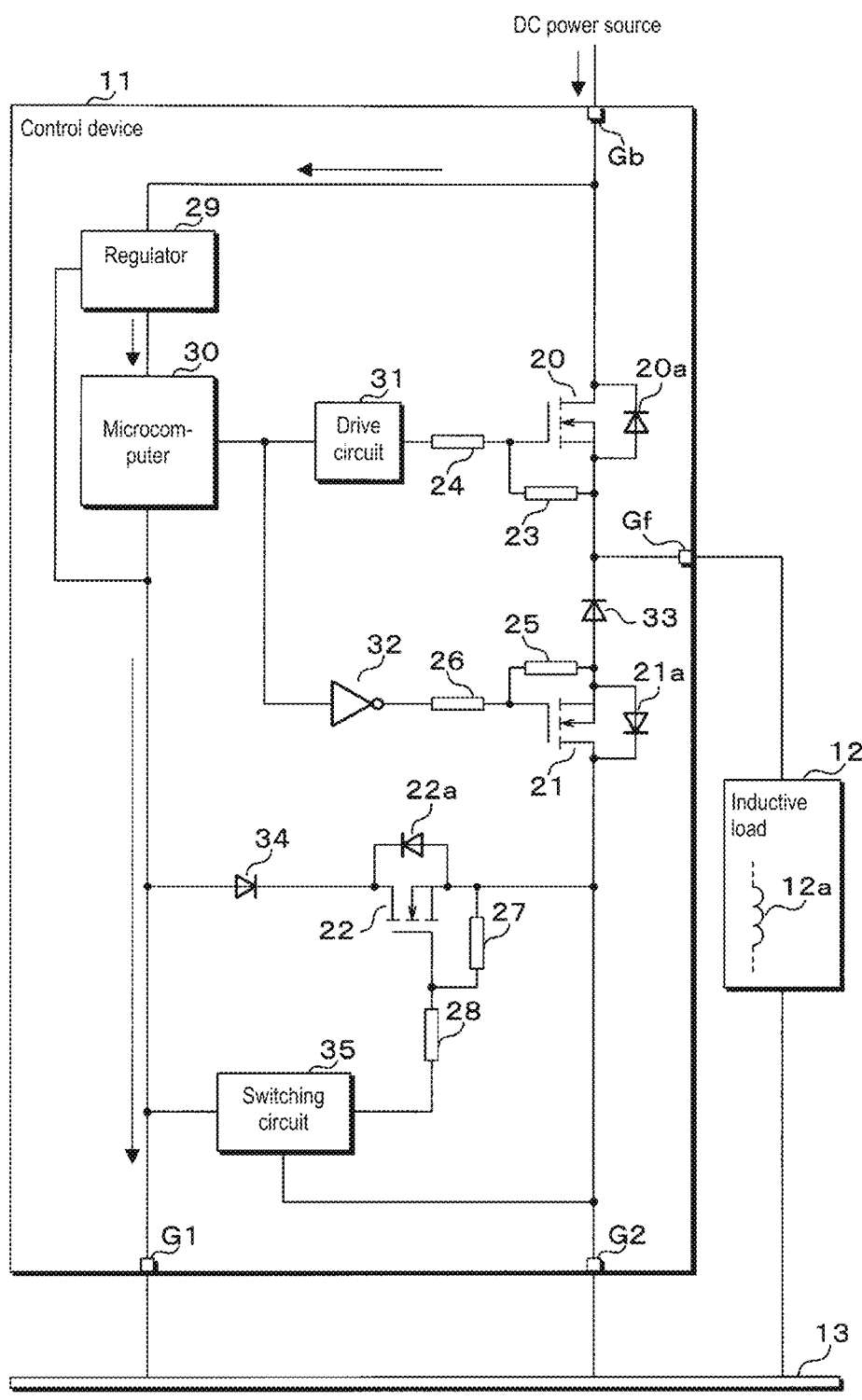
FIG. 2 is a circuit diagram of a control device.

The control device 11 includes a power supply switch 20 (see FIG. 2). When the power supply switch 20 is turned ON from OFF, a current flows from the positive electrode of the DC power source 10 through the power supply switch 20, the inductive load 12, and the grounding conductor 13 in this order, and as a result, power is supplied to the inductive load 12. Upon power being supplied to the inductive load 12, the inductive load 12 starts operating. The power supply switch 20 is disposed in a power supply path from the DC power source 10 to the inductive load 12.

When the power supply switch 20 is turned OFF from ON, the power supply from the DC power source 10 to the inductive load 12 is stopped. The inductive load 12 stops operating when the power supply to the inductive load 12 is stopped. The control device 11 controls the power supply from the DC power source 10 to the inductive load 12 through the power supply switch 20 by turning the power supply switch 20 ON or OFF.

Configuration of Control Device 11

FIG. 2 is a circuit diagram of the control device 11. The control device 11 includes, in addition to the power supply switch 20, a discharge switch 21, a connection switch 22, power supply resistors 23 and 24, discharge resistors 25 and 26, connection resistors 27 and 28, a regulator 29, a microcomputer 30, a drive circuit 31, an inverter 32, a discharge diode 33, a connection diode 34, a switching circuit 35, a first terminal G1, a second terminal G2, a power source terminal Gb, and a load terminal Gf. The first terminal G1 and the second terminal G2 are connected to the grounding conductor 13. The power source terminal Gb is connected to the positive electrode of the DC power source 10. The load terminal Gf is connected to one end of the inductive load 12. As described above, the other end of the inductive load 12 is connected to the grounding conductor 13.

The inductive load 12, the first terminal G1, and the second terminal G2 are connected to three positions on the grounding conductor 13. At least two of the inductive load 12, the first terminal G1, and the second terminal G2 may also be connected to the same position on the grounding conductor 13.

The power supply switch 20, the discharge switch 21, and the connection switch 22 are N-channel field effect transistors (FETs). A parasitic diode 20a is formed in the power supply switch 20. The cathode and the anode of the parasitic diode 20a are connected to the drain and the source of the power supply switch 20, respectively. The power supply resistor 23 is connected between the gate and the source of the power supply switch 20. In addition, one end of the power supply resistor 24 is connected to the gate of the power supply switch 20.

Similarly, a parasitic diode 21a is formed in the discharge switch 21. The cathode and the anode of the parasitic diode 21a are connected to the drain and the source of the discharge switch 21, respectively. The discharge resistor 25 is connected between the gate and the source of the discharge switch 21. In addition, one end of a discharge resistor 26 is connected to the gate of the discharge switch 21. A parasitic diode 22a is formed in the connection switch 22. The cathode and anode of the parasitic diode 22a are connected to the drain and source of the connection switch 22, respectively. The connection resistor 27 is connected between the gate and the source of the connection switch 22. In addition, one end of the connection resistor 28 is connected to the gate of the connection switch 22.

The drain and source of the power supply switch 20 are connected to the power source terminal Gb and the load terminal Gf, respectively. In addition, the drain of the power supply switch 20 is connected to the regulator 29. The regulator 29 is connected to the microcomputer 30 and the first terminal G1. The drive circuit 31 and the inverter 32 each have an input terminal and an output terminal. The microcomputer 30 is connected to the input terminals of the drive circuit 31 and the inverter 32, and the first terminal G1.

The output terminal of the drive circuit 31 is connected to the other end of the power supply resistor 24. The output terminal of the inverter 32 is connected to the other end of the discharge resistor 26. The anode of the connection diode 34 is connected to a connection node between the microcomputer 30 and the first terminal G1. The cathode of the connection diode 34 is connected to the drain of the connection switch 22. The source of the connection switch 22 is connected to the second terminal G2. The cathode of the discharge diode 33 is connected to a connection node between the power supply switch 20 and the load terminal Gf. The connection node between the power supply switch 20 and the load terminal Gf is the connection node between the power supply switch 20 and the inductive load 12. Accordingly, the discharge diode 33 functions as a second diode.

The anode of the discharge diode 33 is connected to the source of the discharge switch 21. The drain of the discharge switch 21 is connected to the second terminal G2. The switching circuit 35 is connected to the other end of the connection resistor 28, the first terminal G1, and the second terminal G2.

Here, the voltage at the gate of each of the power supply switch 20, the discharge switch 21, and the connection switch 22 with respect to the potential of its source is defined as a "gate voltage". The power supply switch 20, the discharge switch 21, and the connection switch 22 are turned ON from OFF when the gate voltage increases to a certain voltage or higher. The gate of the connection switch 22 functions as a control terminal. The certain voltage of the connection switch 22 corresponds to a "predetermined voltage". When the power supply switch 20, the discharge switch 21, and the connection switch 22 are ON, the resistance value between the drain and the source of each switch is very small. For this reason, a current can flow through the drain and the source. Note, that the certain voltage is a positive voltage.

The power supply switch 20, the discharge switch 21, and the connection switch 22 are turned OFF when the gate voltage decreases to a certain voltage or lower. When the power supply switch 20, the discharge switch 21, and the connection switch 22 are OFF, the resistance value between the drain and the source of each switch is very large. For this reason, no current flows through the drain and the source.

The drive circuit 31 increases the voltage at the gate of the power supply switch 20 with respect to the potential of the second terminal G2. As a result, the gate voltage of the power supply switch 20 increases to a certain voltage or higher, and the power supply switch 20 is turned ON. The drive circuit 31 decreases the voltage at the gate of the power supply switch 20 with respect to the potential of the second terminal G2. As a result, the gate voltage of the power supply switch 20 decreases to the certain voltage or lower, and the power supply switch 20 is turned OFF. As described above, the drive circuit 31 turns the power supply switch 20 ON or OFF.

The inverter 32 outputs, from its output terminal, a low-level voltage or a high-level voltage with respect to the potential of the second terminal G2. The low-level voltage output from the inverter 32 is 0 V, for example. The high-level voltage output from the inverter 32 is a voltage across the DC power source 10, for example.

When the inverter 32 switches its output voltage from a low-level voltage to a high-level voltage, the voltage at the gate of the discharge switch 21 with respect to the potential of the second terminal G2 increases. As a result, the gate voltage of the discharge switch 21 increases to a certain voltage or higher, and the discharge switch 21 is turned ON. When the inverter 32 switches its output voltage from a high-level voltage to a low-level voltage, the voltage at the gate of the discharge switch 21 with respect to the potential of the second terminal G2 decreases. As a result, the gate voltage of the discharge switch 21 decreases to lower than the certain voltage, and the discharge switch 21 is turned OFF. As described above, the inverter 32 turns the discharge switch 21 ON or OFF, by switching its output voltage to a low-level voltage or a high-level voltage.

A current flows from the positive electrode of the DC power source 10 through the power source terminals Gb, the regulator 29, the first terminal G1, the grounding conductor 13, and the negative electrode of the DC power source 10 in this order, and as a result, power is supplied to the regulator 29. Here, the voltage at the positive electrode of the DC power source 10 is defined as a "power source voltage". The regulator 29 steps down the power source voltage with respect to the potential of the first terminal G1 to a certain target voltage, and applies the target voltage obtained by the step-down of the power source voltage to the microcomputer 30. The reference potential of the target voltage is the potential of the first terminal G1. By applying the target voltage to the microcomputer 30, power is supplied to the microcomputer 30.

While power is supplied to the microcomputer 30, as indicated by arrows, a current flows from the positive electrode of the DC power source 10 through the power source terminal Gb, the regulator 29, the microcomputer 30, the first terminal G1, the grounding conductor 13, and the negative electrode of the DC power source 10 in this order. Accordingly, the first terminal G1 is disposed downstream of the microcomputer 30 in the current path through which current flows through the microcomputer 30.

The microcomputer 30 outputs a high-level voltage or a low-level voltage to the input terminals of the drive circuit 31 and the inverter 32. The reference potential of a high-level voltage and a low-level voltage output from the microcomputer 30 is the potential of the first terminal G1. The high-level voltage is the target voltage output from the regulator 29, for example. The low-level voltage is 0 V, for example. When the microcomputer 30 switches its output voltage from a low-level voltage to a high-level voltage, the drive circuit 31 turns ON the power supply switch 20 from OFF, and the inverter 32 switches its output voltage from a high-level voltage to a low-level voltage. As a result, the discharge switch 21 is turned OFF from ON.

When the microcomputer 30 switches its output voltage from a high-level voltage to a low-level voltage, the drive circuit 31 turns OFF the power supply switch 20 from ON, and the inverter 32 switches its output voltage from a low-level voltage to a high-level voltage. As a result, the discharge switch 21 is turned ON from OFF.

As described above, the microcomputer 30 switches its output voltage to a high-level voltage, thereby instructing the drive circuit 31 to turn ON the power supply switch 20 and also instructing the inverter 32 to turn OFF the discharge switch 21. Furthermore, the microcomputer 30 switches its output voltage to a low-level voltage, thereby instructing the drive circuit 31 to turn OFF the power supply switch 20 and also instructing the inverter 32 to turn ON the discharge switch 21.

The microcomputer 30 executes a power supply control process for controlling power supply to the inductive load 12. The microcomputer 30 functions as a processor. The microcomputer 30 controls the power supply from the DC power source 10 to the inductive load 12, by instructing the power supply switch 20 to turn ON or OFF.

Figure 3:
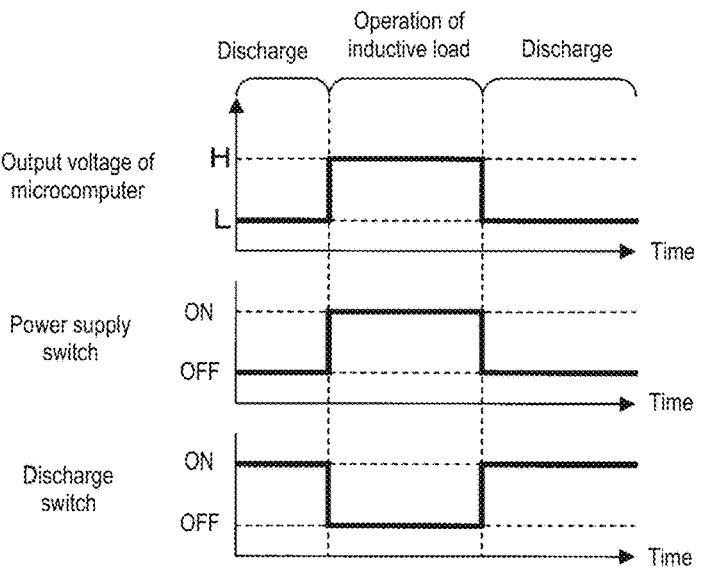
FIG. 3 is a timing chart illustrating a power supply control process.

FIG. 3 is a timing chart illustrating the power supply control process. FIG. 3 shows the change of the output voltage of the microcomputer 30 and the change of the states of the power supply switch 20 and the discharge switch 21. The horizontal axes of the graphs represent time. In FIG. 3, a high-level voltage and a low-level voltage are represented by "H" and "L", respectively.

When the microcomputer 30 switches its output voltage from a low-level voltage to a high-level voltage, the drive circuit 31 turns ON the power supply switch 20 from OFF, and the inverter 32 turns OFF the discharge switch 21 from ON. As a result, a current flows from the positive electrode of the DC power source 10 through the power supply switch 20, the load terminal Gf, the inductive load 12, the grounding conductor 13, and the negative electrode of the DC power source 10 in this order. Accordingly, power is supplied to the inductive load 12, and as a result, the inductive load 12 starts operating. While power is supplied to the inductive load 12, a current continues to flow through the inductor 12a, and energy is stored in the inductor 12a.

The anode of the discharge diode 33 is connected to the anode of the parasitic diode 21a of the discharge switch 21. Accordingly, when the discharge switch 21 is OFF, no current flows through the discharge diode 33.

When the microcomputer 30 switches its output voltage from a high-level voltage to a low-level voltage, the drive circuit 31 turns OFF the power supply switch 20 from ON, and the inverter 32 turns ON the discharge switch 21 from OFF. When the power supply switch 20 is turned OFF, the flow of current through the inductive load 12 is stopped. As a result, power supply to the inductive load 12 is stopped, and the inductive load 12 stops operating.

When the power supply switch 20 is turned OFF, the discharge switch 21 is turned ON. When the discharge switch 21 is ON, a current flows from the one end of the inductive load 12 on the grounding conductor 13 side through the grounding conductor 13, the second terminal G2, the discharge switch 21, the discharge diode 33, the load terminal Gf, and the other end of the inductive load 12 in this order. As a result, the energy stored in the inductor 12a is released. Accordingly, the voltage at the load terminal Gf with respect to the potential of the grounding conductor 13 is prevented from greatly reducing.

Configuration of Switching Circuit 35

Figure 4:
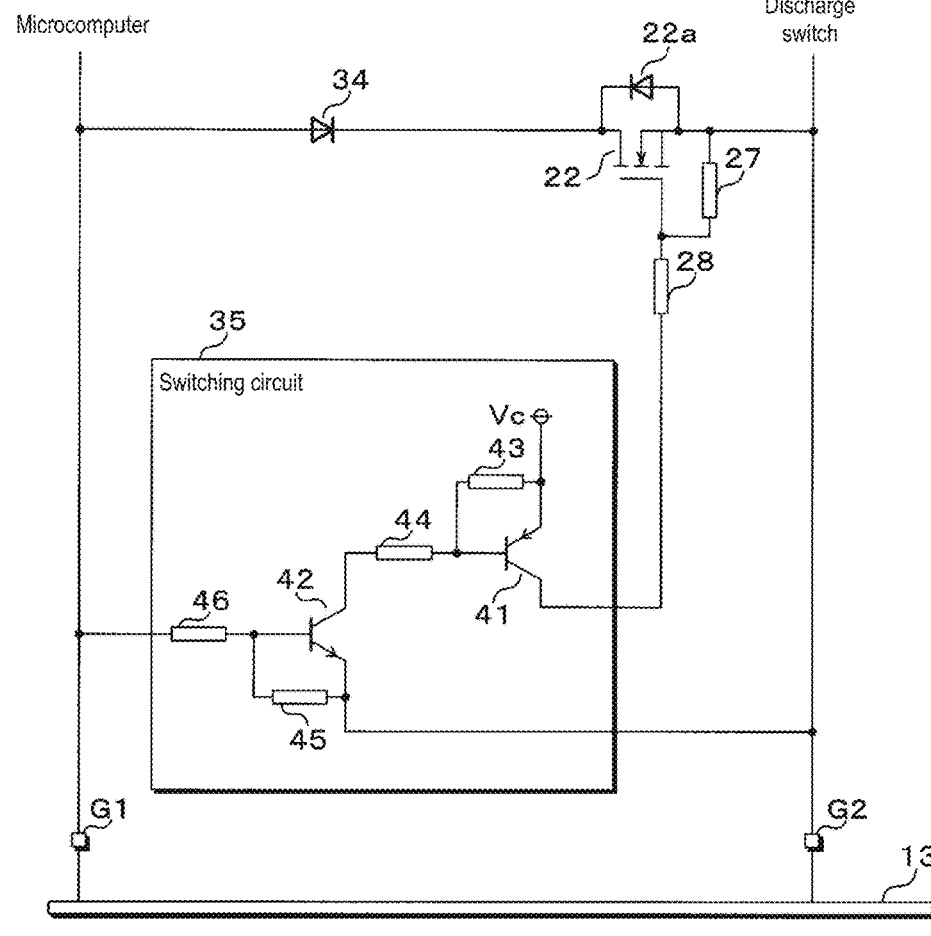
FIG. 4 is a circuit diagram of a switching circuit.

FIG. 4 is a circuit diagram of the switching circuit 35. The switching circuit 35 includes a first circuit-switch 41, a second circuit-switch 42, first circuit-resistors 43 and 44, and second circuit-resistors 45 and 46. The first circuit-switch 41 is a PNP-type bipolar transistor. The second circuit-switch 42 is an NPN-type bipolar transistor. A predetermined circuit voltage Vc is applied to the emitter of the first circuit-switch 41. A first example of the circuit voltage Vc is the voltage across the DC power source 10. A second example of the circuit voltage Vc is the target voltage output from the regulator 29.

The collector of the first circuit-switch 41 is connected to the other end of the connection resistor 28. That is to say, the collector of the first circuit-switch 41 is connected to the gate of the connection switch 22 via the connection resistor 28. The first circuit-resistor 43 is connected between the emitter and the base of the first circuit-switch 41. The first circuit-resistor 44 is connected between the base of the first circuit-switch 41 and the collector of the second circuit-switch 42. The emitter of the second circuit-switch 42 is connected to the second terminal G2. That is to say, the second circuit-switch 42 is connected between the base of the first circuit-switch 41 and the second terminal G2. In addition, the second circuit-resistor 45 is connected between the base and the emitter of the second circuit-switch 42. The base of the second circuit-switch 42 is further connected to one end of the second circuit-resistor 46. The other end of the second circuit-resistor 46 is connected to the first terminal G1.

For the first circuit-switch 41 and the second circuit-switch 42, a voltage of the base with respect to the potential of the emitter is defined as a "base voltage". When the base voltage of the first circuit-switch 41 is a constant first voltage or lower, the first circuit-switch 41 is ON. The first voltage is a negative voltage, and corresponds to a second predetermined voltage. When the first circuit-switch 41 is ON, the resistance value between the emitter and the collector of the first circuit-switch 41 is very small. Accordingly, a current flows through the emitter and the collector of the first circuit-switch 41 in this order. The emitter of the first circuit-switch 41 functions as an input terminal to which the current is input. The collector of the first circuit-switch 41 functions as an output terminal from which the current is output. The base of the first circuit-switch 41 functions as a second control terminal.

When the base voltage of the first circuit-switch 41 exceeds the first voltage, the first circuit-switch 41 is OFF. When the first circuit-switch 41 is OFF, the resistance value between the emitter and the collector of the first circuit-switch 41 is very large. In this case, no current flows through the emitter and the collector of the first circuit-switch 41.

When the base voltage of the second circuit-switch 42 is a certain second voltage or higher, the second circuit-switch 42 is ON. The second voltage is a positive voltage. When the second circuit-switch 42 is ON, the resistance value between the collector and the emitter of the second circuit-switch 42 is very small. Accordingly, a current flows through the collector and the emitter of the second circuit-switch 42 in this order. The collector of the second circuit-switch 42 functions as an input terminal to which the current is input. The emitter of the second circuit-switch 42 functions as an output terminal from which the current is output.

When the base voltage of the second circuit-switch 42 is lower than the second voltage, the second circuit-switch 42 is OFF. When the second circuit-switch 42 is OFF, the resistance value between the emitter and the collector of the second circuit-switch 42 is very large. Accordingly, no current flows through the emitter and collector of the second circuit-switch 42.

Hereinafter, the voltage at the first terminal G1 with respect to the potential of the second terminal G2 is defined as a "terminal voltage". When the first terminal G1 is connected to the grounding conductor 13, the terminal voltage is 0 V. When the terminal voltage is 0 V, no current flows through the second circuit-resistors 45 and 46. Accordingly, the base voltage of the second circuit-switch 42 is 0 V, that is to say, the base voltage of the second circuit-switch 42 is lower than the second voltage, which is a positive voltage. As a result, the second circuit-switch 42 is turned OFF.

When the second circuit-switch 42 is OFF, no current flows through the first circuit-resistors 43 and 44. Accordingly, the base voltage of the first circuit-switch 41 is 0 V, that is to say, the base voltage of the first circuit-switch 41 exceeds the first voltage, which is a negative voltage. As a result, the first circuit-switch 41 is turned OFF. When the first circuit-switch 41 is OFF, no current flows through the connection resistors 27 and 28. Accordingly, the gate voltage of the connection switch 22 is 0 V, that is to say, the gate voltage of the connection switch 22 is lower than the certain voltage, which is a positive voltage. As a result, the connection switch 22 is turned OFF.

As described above, when the second circuit-switch 42 is OFF, the first circuit-switch 41 is also OFF. Furthermore, when the first circuit-switch 41 is OFF, the connection switch 22 is also OFF.

If the first terminal G1 is disconnected from the grounding conductor 13, the flow of current through the first terminal G1 is stopped, and as a result, the terminal voltage increases. Also, if disturbance noise enters the first terminal G1, the terminal voltage may increase. When the terminal voltage exceeds 0 V, a current flows through the second circuit-resistors 46 and 45 and the second terminal G2 in this order, and as a result, a voltage drop occurs in the second circuit-resistor 45. As a result, the base voltage of the second circuit-switch 42 increases. When the terminal voltage is the threshold voltage, the base voltage of the second circuit-switch 42 is the second voltage.

When the terminal voltage increases to the threshold voltage or higher, the base voltage of the second circuit-switch 42 increases to the second voltage or higher. As a result, the second circuit-switch 42 is turned ON. When the second circuit-switch 42 is ON, a current flows through the first circuit-resistors 43 and 44, the second circuit-switch 42, the second terminal G2, and the grounding conductor 13 in this order. Accordingly, a voltage drop occurs in the first circuit-resistor 43. This voltage drop causes the base voltage of the first circuit-switch 41 to decrease to the first voltage or lower. Therefore, when the second circuit-switch 42 is turned ON from OFF, the first circuit-switch 41 is also turned ON from OFF.

When the first circuit-switch 41 is ON, a current flows through the first circuit-switch 41, the connection resistors 28 and 27, the second terminal G2, and the grounding conductor 13 in this order. As a result, a voltage drop occurs in the connection resistor 27. This voltage drop causes the gate voltage of the connection switch 22 to increase to a certain voltage or higher. Therefore, when the first circuit-switch 41 is turned ON from OFF, the connection switch 22 is also turned ON from OFF.

As described above, when the second circuit-switch 42 is ON, the first circuit-switch 41 is also ON. Furthermore, when the first circuit-switch 41 is ON, the connection switch 22 is also ON.

Figure 5:
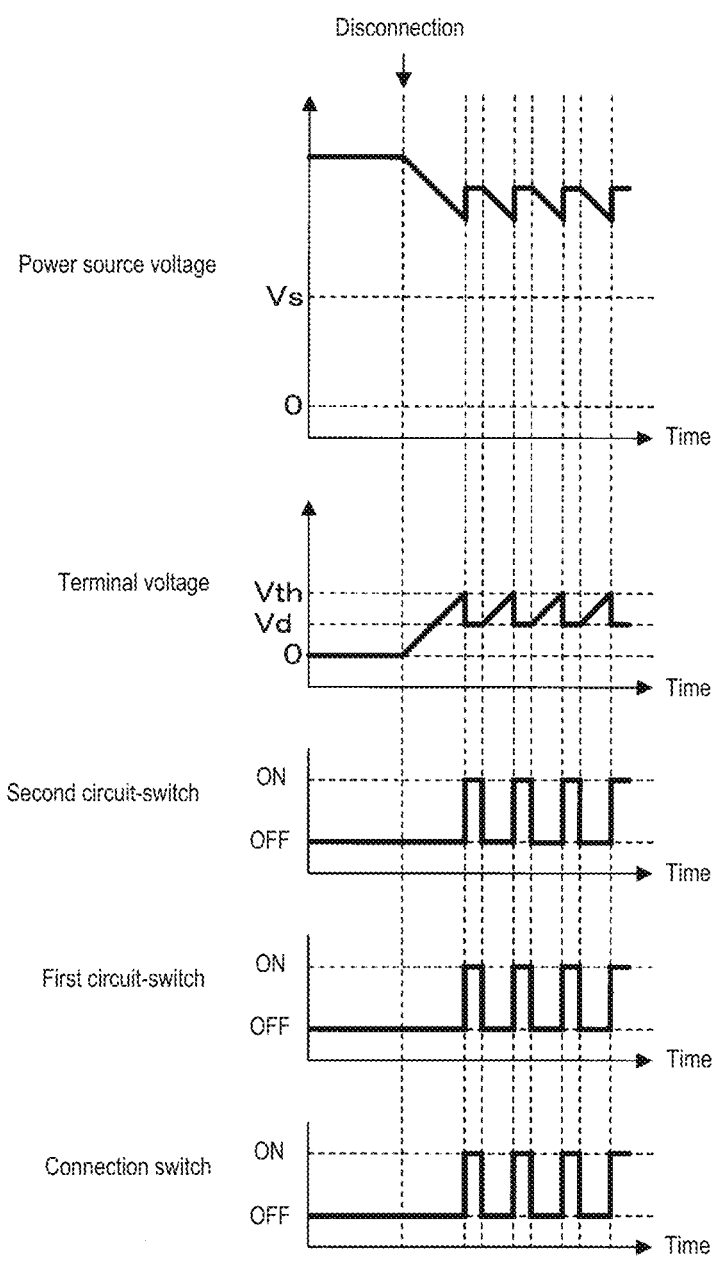
FIG. 5 is a timing chart illustrating the operation of the switching circuit.

FIG. 5 is a timing chart illustrating the operation of the switching circuit 35. FIG. 5 shows changes in the power source voltage and the terminal voltage. The reference potential of the power source voltage shown in FIG. 5 is the potential of the first terminal G1. As described above, the terminal voltage is the voltage at the first terminal G1 with respect to the potential of the second terminals G2. FIG. 5 further shows the change in the states of the second circuit-switch 42, the first circuit-switch 41, and the connection switch 22. The horizontal axes of the five graphs shown in FIG. 5 represent "time". A high-level voltage and a low-level voltage are represented by "H" and "L", respectively.

The regulator 29 steps down the power source voltage with respect to the potential of the first terminal G1, to a target voltage. "Vs" represents the target voltage. "Vth" represents a threshold voltage. "Vd" is a voltage across the connection diode 34 when a current flows in the order of the anode and the cathode of the connection diode 34. That is to say, Vd is a forward voltage of the connection diode 34.

The operation of the switching circuit 35 when no disturbance noise is generated will be described below. When the first terminal G1 is connected to the grounding conductor 13, the terminal voltage is 0 V. Accordingly, the power source voltage with respect to the potential of the first terminal G1 is the voltage across the DC power source 10, and is higher than the target voltage Vs. As described above, when the terminal voltage is 0 V, the second circuit-switch 42 is OFF. When the second circuit-switch 42 is OFF, the first circuit-switch 41 and the connection switch 22 are also OFF.

When the first terminal G1 is disconnected from the grounding conductor 13, the current flowing through the first terminal G1 is stopped, and as a result, the terminal voltage increases. When the terminal voltage increases, the power source voltage with respect to the potential of the first terminal G1 decreases. When the terminal voltage increases to the threshold voltage Vth or higher, the second circuit-switch 42 is turned ON from OFF. As a result, the first circuit-switch 41 and the connection switch 22 are sequentially turned ON from OFF.

When the connection switch 22 is ON, a current flows from the positive electrode of the DC power source 10 through the power source terminals Gb, the regulator 29, the connection diode 34, the connection switch 22, the second terminal G2, and the negative electrode of the DC power source 10 in this order. As a result, power is supplied to the regulator 29. The regulator 29 steps down the power source voltage with respect to the potential of the first terminal G1 to the target voltage Vs, and applies, to the microcomputer 30, the target voltage Vs with respect to the potential of the first terminal G1. In this case, a current flows from the positive electrode of the DC power source 10 through the power source terminal Gb, the regulator 29, the microcomputer 30, the connection diode 34, the connection switch 22, the second terminals G2, and the negative electrode of the DC power source 10 in this order. As a result, power is supplied to the microcomputer 30.

The second circuit-switch 42 is turned ON from OFF, before the power source voltage with respect to the potential of the first terminal G1 decreases to lower than the target voltage Vs. Accordingly, the switching circuit 35 turns ON the connection switch 22 from OFF in a state where the power source voltage with respect to the potential of the first terminal G1 is the target voltage Vs or higher. Therefore, even when the first terminal G1 is disconnected from the grounding conductor 13 and the terminal voltage increases, the regulator 29 continues to apply the target voltage Vs to the microcomputer 30.

When the connection switch 22 is turned ON, the terminal voltage decreases to the forward voltage Vd of the connection diode 34. If the terminal voltage decreases to the forward voltage Vd, the power source voltage with respect to the potential of the first terminal G1 increases. The forward voltage Vd is lower than the threshold voltage Vth. Accordingly, if the terminal voltage decreases to the forward voltage Vd, the second circuit-switch 42 is turned OFF from ON. As a result, the first circuit-switch 41 and the connection switch 22 are sequentially turned OFF from ON.

If the terminal voltage decreases to the forward voltage Vd, the connection switch 22 is turned OFF in a state where the first terminal G1 is disconnected from the grounding conductor 13. As a result, the terminal voltage increases again. When the terminal voltage increases to the threshold voltage Vth or higher, the terminal voltage decreases to the forward voltage Vd again. Accordingly, if the first terminal G1 is disconnected from the grounding conductor 13, the terminal voltage varies between the forward voltage Vd and the threshold voltage Vth. Therefore, the target voltage Vs is continuously applied to the microcomputer 30.

Even in a state where the first terminal G1 is connected to the grounding conductor 13, when the terminal voltage increases to the threshold voltage or higher due to disturbance noise, the second circuit-switch 42, the first circuit-switch 41, and the connection switch 22 are sequentially turned ON from OFF. As a result, the terminal voltage decreases to the forward voltage Vd. For this reason, even when disturbance noise enters the first terminal G1, the terminal voltage does not exceed the threshold voltage Vth.

As described above, when the terminal voltage increases to the threshold voltage Vth or higher, the second circuit-switch 42 is turned ON from OFF. When the second circuit-switch 42 is turned ON from OFF, the gate voltage of the first circuit-switch 41 decreases and becomes equal to or lower than the first voltage, which is a negative voltage, and as a result, the first circuit-switch 41 is turned ON from OFF. When the first circuit-switch 41 is turned ON from OFF, the switching circuit 35 turns ON the connection switch 22 from OFF.

Note, that when the forward voltage Vd of the connection diode 34 is the threshold voltage Vth or higher, the terminal voltage is kept at the forward voltage Vd of the connection diode 34 after the second circuit-switch 42 is turned ON from OFF. The second circuit-switch 42, the first circuit-switch 41, and the connection switch 22 are kept in the ON state, and the second circuit-switch 42 is not alternately switched between the ON state and the OFF state.

As described above, in the control device 11, even when the terminal voltage increases due to disconnection of the first terminal G1 from the grounding conductor 13 or entrance of disturbance noise, the terminal voltage does not exceed the larger voltage of the threshold voltage Vth and the forward voltage Vd, and the terminal voltage is kept from increasing.

Disposition of Components Included in Control Device 11

Figure 6:
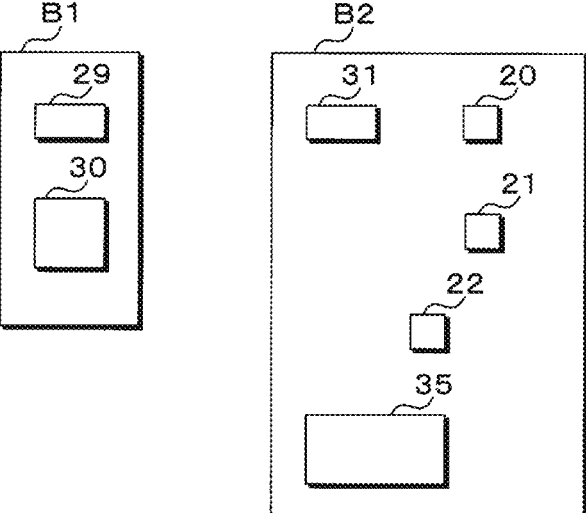
FIG. 6 is a diagram showing the disposition of the components included in the control device.

FIG. 6 is a diagram showing the disposition of the components included in the control device 11. The control device 11 includes a first board B1 and a second board B2. The second board B2 is different from the first board B1. The regulator 29 and the microcomputer 30 are disposed on the first board B1. The power supply switch 20, the discharge switch 21, the connection switch 22, the drive circuit 31, and the switching circuit 35 are disposed on the second board B2. The disposition in the switching circuit 35 means the disposition of the first circuit-switch 41, the second circuit-switch 42, the first circuit-resistors 43 and 44, and the second circuit-resistors 45 and 46, which are included in the switching circuit 35.

In FIG. 6, the power supply resistors 23 and 24, the discharge resistors 25 and 26, the connection resistors 27 and 28, the inverter 32, the discharge diode 33, the connection diode 34, the first terminal G1 and the second terminal G2, the power source terminal Gb, and the load terminal Gf are not shown. The first terminal G1 is disposed on the first board B1. The power supply resistors 23 and 24, the discharge resistors 25 and 26, the connection resistors 27 and 28, the inverter 32, the discharge diode 33, the connection diode 34, the second terminal G2, the power source terminal Gb, and the load terminal Gf are disposed on the second board B2. The first board B1 and the second board B2 are connected by a connection line.

As described above, if the circuit components are disposed on the first board B1 and the second board B2, for example, when a failure occurs in the power supply switch 20 disposed on the second board B2, the power supply switch 20 can be changed by changing the second board B2 without changing the regulator 29 and the microcomputer 30.

Note, that the connection switch 22, the connection resistors 27 and 28, the connection diode 34, and the switching circuit 35 are not limited to being disposed on the second board B2, and may also be disposed on the first board B1. In the control device 11, the number of boards on which circuit components are disposed is not limited to two, and may also be one, or three or more. The circuit components include the power supply switch 20, the discharge switch 21, the connection switch 22, the regulator 29, the microcomputer 30, the drive circuit 31, the inverter 32, the discharge diode 33, the connection diode 34, and the switching circuit 35, which are illustrated in FIG. 2.

Second Embodiment

In the first embodiment, the microcomputer 30 may also monitor the power source voltage with respect to the potential of the first terminal G1.

The following will describe differences of a second embodiment from the first embodiment. Configurations aside from those described hereinafter are the same as in the first embodiment. For this reason, constituent elements that are the same as in the first embodiment will be given the same reference signs as in the first embodiment, and descriptions thereof will be omitted.

Configuration of Control Device 11

Figure 7:
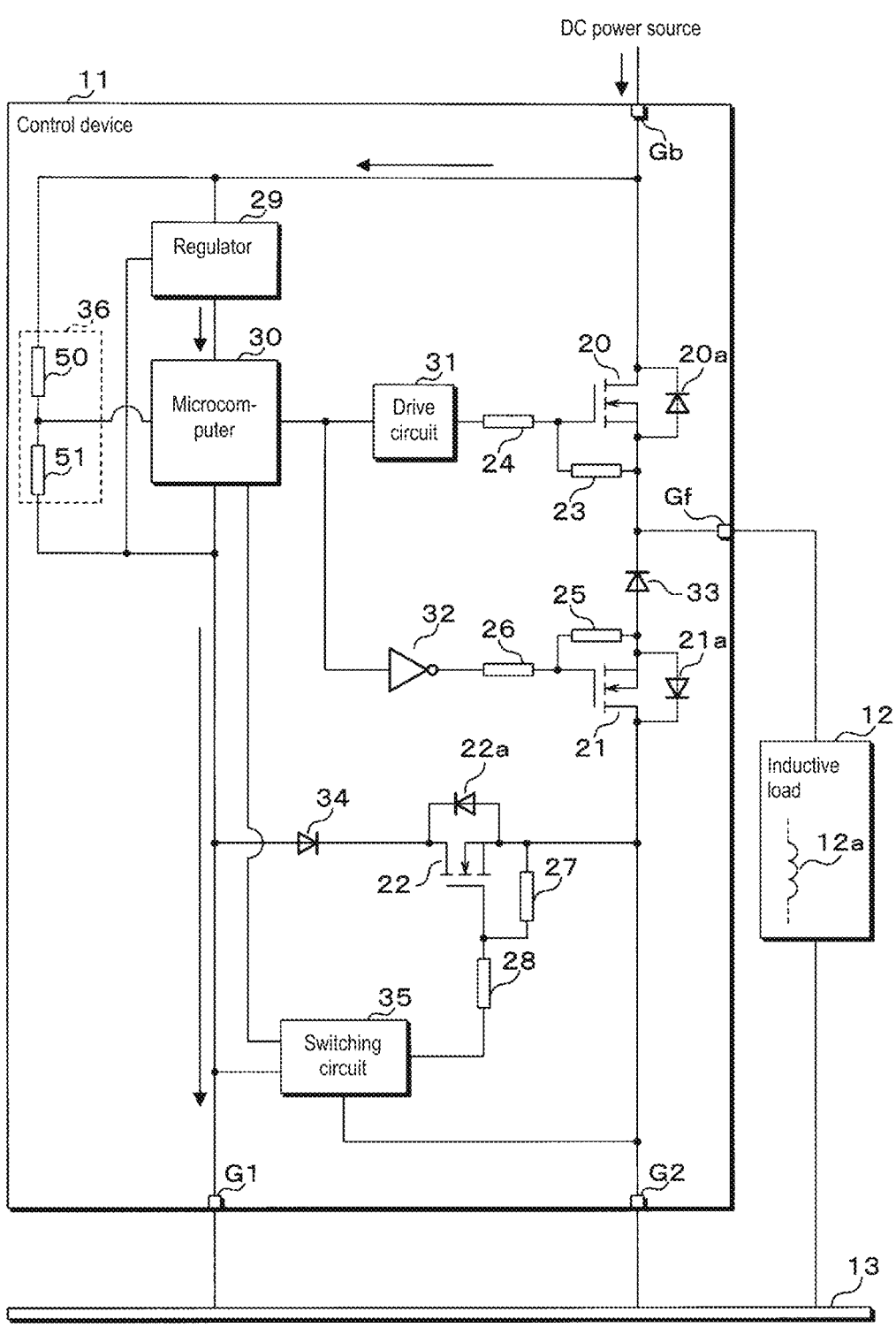
FIG. 7 is a circuit diagram of a control device according to a second embodiment.

FIG. 7 is a circuit diagram of a control device 11 according to the second embodiment. The control device 11 according to the second embodiment has the same components as those of the control device 11 according to the first embodiment. The control device 11 further includes a voltage detection circuit 36. The voltage detection circuit 36 includes voltage dividing resistors 50 and 51. One end of the voltage dividing resistor 50 is connected to the drain of the power supply switch 20. The other end of the voltage dividing resistor 50 is connected to one end of the voltage dividing resistor 51. The other end of the voltage dividing resistor 51 is connected to the first terminal G1. A connection node between the voltage dividing resistor 50 and the voltage dividing resistor 51 is connected to the microcomputer 30.

The voltage dividing resistors 50 and 51 divide the power source voltage of the DC power source 10 with respect to the potential of the first terminal G1. The divided voltage obtained by dividing the power source voltage by the voltage dividing resistors 50 and 51 is a voltage across the voltage dividing resistor 51, and is proportional to the power source voltage with respect to the potential of the first terminal G1. The divided voltage is power source voltage information indicating the power source voltage. As described above, the voltage detection circuit 36 detects the power source voltage of the DC power source 10 with respect to the potential of the first terminal G1, and notifies the microcomputer 30 of the detected power source voltage.

Configuration of Switching Circuit 35

Figure 8:
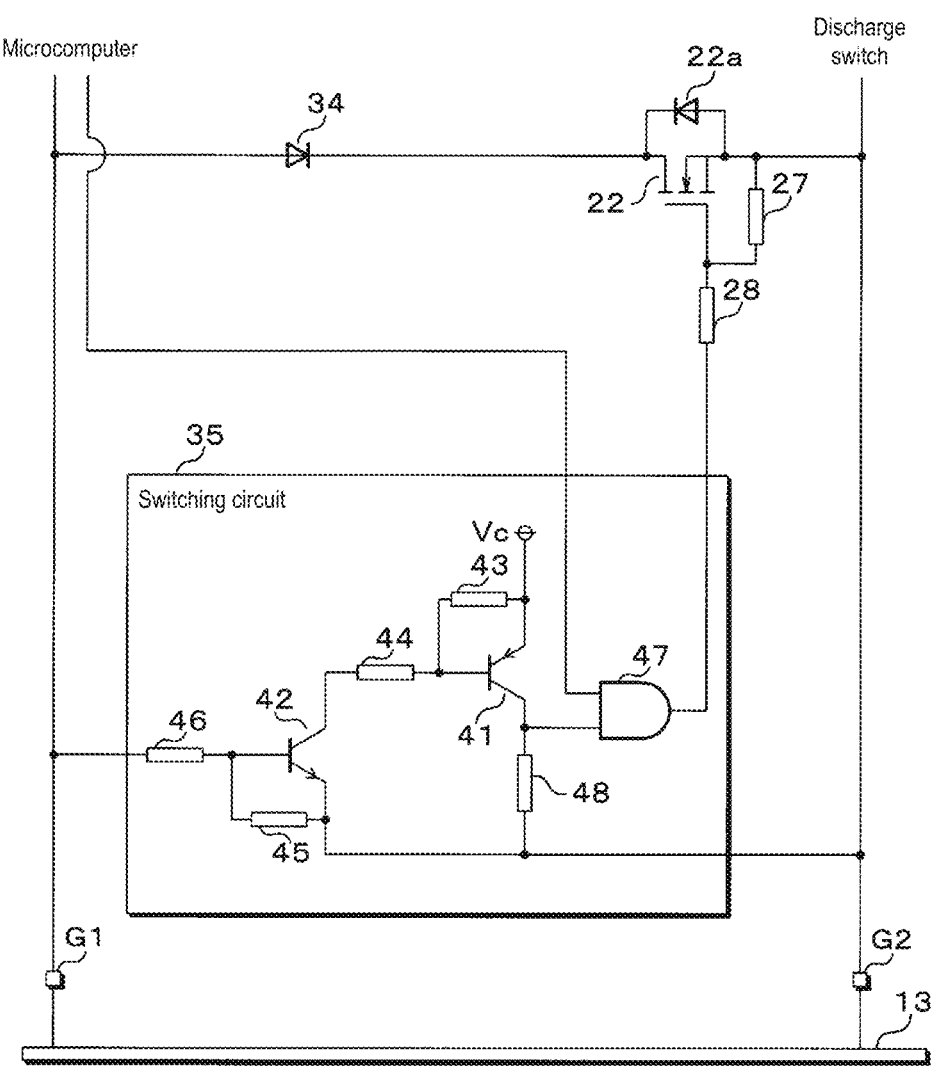
FIG. 8 is a circuit diagram of a switching circuit.

FIG. 8 is a circuit diagram of a switching circuit 35. The switching circuit 35 according to the second embodiment includes the same components as the switching circuit 35 in the first embodiment. The switching circuit 35 according to the second embodiment further includes an AND circuit 47 and a third circuit-resistor 48. The AND circuit 47 includes two input terminals and one output terminal. The third circuit-resistor 48 is connected between the collector of the first circuit-switch 41 and the second terminal G2.

One input terminal of the AND circuit 47 is connected to the microcomputer 30. The other input terminal of the AND circuit 47 is connected to a connection node between the first circuit-switch 41 and the third circuit-resistor 48. As described in the first embodiment, one end of the connection resistor 28 is connected to the gate of the connection switch 22. The output terminal of the AND circuit 47 is connected to the other end of the connection resistor 28.

When the power source voltage detected by the voltage detection circuit 36 is a set voltage or higher, the microcomputer 30 outputs a low-level voltage to the input terminal of the AND circuit 47. The set voltage is a predetermined voltage, and is set in advance. The reference potential of the low-level voltage input from the microcomputer 30 to the AND circuit 47 is the potential of the first terminal G1. The low-level voltage is 0 V, for example. When the power source voltage detected by the voltage detection circuit 36 is the set voltage or lower, the microcomputer 30 outputs a high-level voltage to the input terminal of the AND circuit 47. The reference potential of the high-level voltage input from the microcomputer 30 to the AND circuit 47 is also the potential of the first terminal G1. The high-level voltage is the target voltage output from the regulator 29, for example.

The voltage across the third circuit-resistor 48 is input to the AND circuit 47. Hereinafter, the voltage across the third circuit-resistor 48 is referred to as the "resistor voltage". A second threshold voltage is set in the AND circuit 47. The second threshold voltage is higher than 0 V, and is the circuit voltage Vc or lower.

When the input voltage input from the microcomputer 30 to the AND circuit 47 is a low-level voltage or the resistor voltage is lower than the second threshold voltage, the AND circuit 47 outputs a low-level voltage from its output terminal. The reference potential of the low-level voltage output from the AND circuit 47 is the potential of the second terminal G2. The low-level voltage is 0 V, for example. When the voltage output from the AND circuit 47 is a low-level voltage, no current flows through the connection resistors 27 and 28. Accordingly, the gate voltage of the connection switch 22 is 0 V, that is to say, the gate voltage of the connection switch 22 is lower than a certain voltage, which is a positive voltage. As a result, the connection switch 22 is turned OFF.

When the input voltage input from the microcomputer 30 to the AND circuit 47 is a high-level voltage and the resistor voltage is the second threshold voltage or higher, the AND circuit 47 outputs a high-level voltage from its output terminal. The reference potential of the high-level voltage output from the AND circuit 47 is the potential of the second terminal G2. The first example of the high-level voltage is a voltage across the DC power source 10. The second example of the high-level voltage is the target voltage output from the regulator 29.

When the AND circuit 47 outputs a high-level voltage, a current flows through the connection resistors 28 and 27, the second terminal G2, and the grounding conductor 13 in this order. As a result, a voltage drop occurs in the connection resistor 27. This voltage drop causes the gate voltage of the connection switch 22 to increase to a certain voltage or higher. Accordingly, when the AND circuit 47 outputs a high-level voltage, the connection switch 22 is ON.

Figure 9:
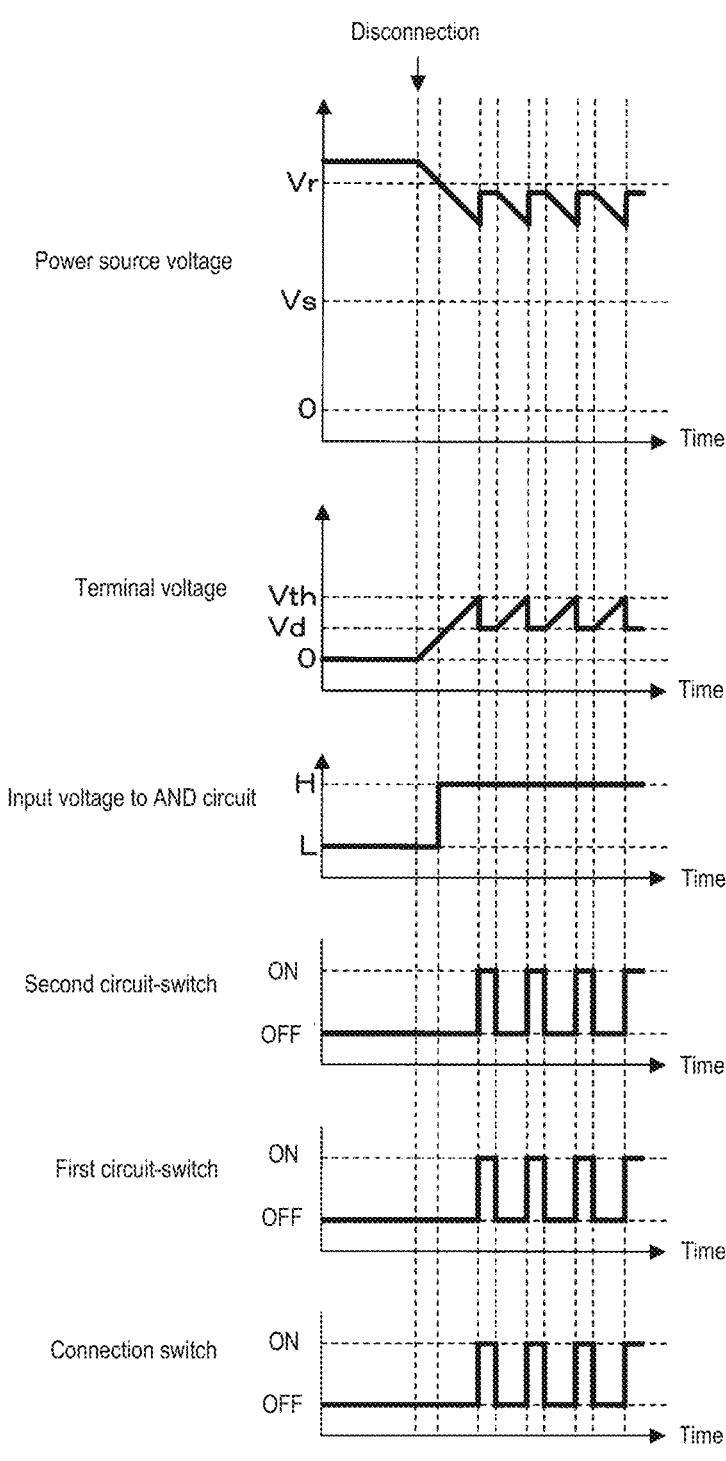
FIG. 9 is a timing chart illustrating the operation of the switching circuit.

FIG. 9 is a timing chart illustrating the operation of the switching circuit 35. FIG. 9 shows the changes in the power source voltage, the terminal voltage, and the voltage input to the AND circuit 47. The reference potential of the power source voltage shown in FIG. 9 is the potential of the first terminal G1. As described in the first embodiment, the terminal voltage is the voltage at the first terminal G1 with respect to the potential of the second terminals G2. FIG. 9 further shows changes in the states of the first circuit-switch 41, the second circuit-switch 42, and the connection switch 22. The horizontal axes of the five graphs shown in FIG. 9 represent "time". A high-level voltage and a low-level voltage are represented by "H" and "L", respectively.

As in FIG. 5, "Vs", "Vth", and "Vd" are the target voltage, the threshold voltage, and the forward voltage of the connection diode 34, respectively. Also, "Vr" is a set voltage.

Hereinafter, the operation of the switching circuit 35 in a case where no disturbance noise is generated and the threshold voltage exceeds the forward voltage Vd of the connection diode 34 will be described. When the first terminal G1 is connected to the grounding conductor 13, the terminal voltage is 0 V. Accordingly, the power source voltage with respect to the potential of the first terminal G1 is the voltage across the DC power source 10, and is higher than the set voltage Vr. Here, the target voltage Vs is higher than the set voltage Vr. For this reason, the input voltage input to the AND circuit 47 from the microcomputer 30 is a low-level voltage.

As described in the first embodiment, when the terminal voltage is 0 V, the first circuit-switch 41, the second circuit-switch 42, and the connection switch 22 are OFF. Accordingly, no current flows through the third circuit-resistor 48, and as a result, the resistor voltage is 0 V and is lower than the second threshold voltage. Therefore, the voltage output from the AND circuit 47 is a low-level voltage, and the connection switch 22 is OFF.

When the first terminal G1 is disconnected from the grounding conductor 13, the current flowing through the first terminal G1 is stopped, and as a result, the terminal voltage increases. When the terminal voltage increases, the power source voltage with respect to the potential of the first terminal G1 decreases. When the power source voltage with respect to the potential of the first terminal G1 decreases to lower than the set voltage Vr, the input voltage input to the AND circuit 47 from the microcomputer 30 is switched from a low-level voltage to a high-level voltage.

When the terminal voltage increases to the threshold voltage Vth or higher in a state where the input voltage input to the AND circuit 47 is a high-level voltage, the second circuit-switch 42 is turned ON from OFF. As a result, the first circuit-switch 41 is turned ON from OFF. When the first circuit-switch 41 is ON, a current flows through the first circuit-switch 41, the third circuit-resistor 48, the second terminal G2, and the grounding conductor 13 in this order. As a result, the resistor voltage increases from 0 V to the circuit voltage Vc. In this case, the circuit voltage Vc is the second threshold voltage or higher, and as a result, the AND circuit 47 switches its output voltage from a low-level voltage to a high-level voltage. As a result, the connection switch 22 is turned ON from OFF.

As described in the first embodiment, when the connection switch 22 is ON, the terminal voltage decreases to the forward voltage Vd of the connection diode 34. When the terminal voltage decreases to the forward voltage Vd, the second circuit-switch 42 is turned OFF from ON. As a result, the first circuit-switch 41 is turned OFF from ON, and the resistor voltage decreases to 0 V from the circuit voltage Vc. As a result, the AND circuit 47 switches its output voltage from a high-level voltage to a low-level voltage, and the connection switch 22 is turned OFF from ON. As described in the first embodiment, when the terminal voltage decreases to the forward voltage Vd, the power source voltage with respect to the potential of the first terminal G1 increases. Therefore, the power source voltage with respect to the potential of the first terminal G1 does not increase to the set voltage Vr or higher.

When the connection switch 22 is turned OFF in a state where the first terminal G1 is disconnected from the grounding conductor 13, the terminal voltage increases again. When the terminal voltage increases to the threshold voltage Vth or higher in a state where the power source voltage with respect to the potential of the first terminal G1 is lower than the set voltage Vr, the terminal voltage decreases to the forward voltage Vd again. Accordingly, if the first terminal G1 is disconnected from the grounding conductor 13, the terminal voltage varies between the forward voltage Vd and the threshold voltage Vth. Therefore, the target voltage Vs is continuously applied to the microcomputer 30.

Even when the first terminal G1 is connected to the grounding conductor 13, if the terminal voltage increases to the threshold voltage or higher and the power source voltage with respect to the potential of the first terminal G1 decreases to the set voltage Vr or lower due to disturbance noise, the connection switch 22 is turned ON from OFF. As a result, the terminal voltage decreases to the forward voltage Vd. For this reason, even when disturbance noise enters the first terminal G1, the terminal voltage does not exceed the threshold voltage Vth.

As described above, when the terminal voltage increases to the threshold voltage Vth or higher in a state where the power source voltage detected by the voltage detection circuit 36 is lower than the set voltage Vr, the switching circuit 35 turns ON the connection switch from OFF. Accordingly, when the terminal voltage is highly likely to have increased, the connection switch 22 is turned ON from OFF. Note, that the set voltage Vr corresponds to a third predetermined voltage.

Here, the set voltage Vr may be any voltage that exceeds the power source voltage that is set when the terminal voltage is the threshold voltage Vth. Accordingly, the set voltage Vr may be lower than or equal to the power source voltage that is set when the terminal voltage is the forward voltage Vd of the connection diode 34. In this configuration, the second circuit-switch 42, the first circuit-switch 41, and the connection switch 22 are also alternately turned ON and OFF.

Here, it is assumed that the power source voltage that is set when the terminal voltage is the forward voltage Vd of the connection diode 34 is the set voltage Vr or higher, and the forward voltage Vd of the connection diode 34 is the threshold voltage Vth or higher. In this case, after the second circuit-switch 42 is turned ON from OFF, the terminal voltage is kept at the forward voltage Vd of the connection diode 34. The second circuit-switch 42, the first circuit-switch 41, and the connection switch 22 are kept in the ON state, and the second circuit-switch 42 is not alternately switched between the ON state and the OFF state.

The control device 11 according to the second embodiment similarly achieves the effects achieved by the control device 11 according to the first embodiment, except for the effect achieved by the collector of the first circuit-switch 41 being connected to the connection resistor 28.

Modifications

In the switching circuit 35 according to the first and second embodiments, the first circuit-switch 41 is not limited to a PNP-type bipolar transistor, and may also be a P-channel FET, for example. The second circuit-switch 42 is not limited to an NPN-type bipolar transistor, and may also be an N-channel FET or an insulated gate bipolar transistor (IGBT). The switching circuit 35 may turn ON the connection switch 22 from OFF when the terminal voltage increases to the threshold voltage or higher. Therefore, the configuration of the switching circuit 35 is not limited to the configuration including the first circuit-switch 41 and the second circuit-switch 42.

In the first and second embodiments, the power supply switch 20 and the connection switch 22 are not limited to N-channel FETs, and may also be P-channel FETs, bipolar transistors, or the like. When the connection switch 22 is a P-channel FET, the configuration of the switching circuit 35 is different from the configuration including the first circuit-switch 41 and the second circuit-switch 42. The discharge switch 21 is not limited to an N-channel FET, and may also be an NPN-type bipolar transistor, for example.

In the first and second embodiments, the load to which power is supplied from the DC power source 10 is not limited to an inductive load 12, and may also be a load that does not include an inductor 12a. In this case, the control device 11 may not include the discharge switch 21, the discharge resistors 25 and 26, the inverter 32, and the discharge diode 33. In addition, in control device 11, there is no direct connection between the load terminal Gf and the second terminal G2.

In the first and second embodiments, the control device 11 is not limited to a device configured to control power supply. The control device 11 may be any device configured to perform control. In this case, the microcomputer 30 executes a control process different from the process for controlling power supply. This process is a process for transmitting a control signal related to control of the vehicle M, for example. When the microcomputer 30 executes a control process different from the process for controlling power supply, the control device 11 does not include the power supply switch 20, the discharge switch 21, the power supply resistors 23 and 24, the discharge resistors 25 and 26, the drive circuit 31, and the inverter 32.

The disclosed first and second embodiments are to be construed as being exemplary and non-limiting in all respects. The scope of the present disclosure is indicated by the scope of the claims rather than the meaning described above, and is intended to include all changes within the meaning and scope equivalent to the scope of the claims.

The invention claimed is:

1. A control device for a vehicle, comprising:
   a processor configured to execute a process;
   a first terminal disposed downstream of the processor in a current path through which a current flows through the processor;
   a diode having an anode connected to a connection node between the processor and the first terminal;
   a connection switch having one end connected to a cathode of the diode;
   a second terminal connected to the other end of the connection switch;
   a switching circuit configured to turn ON the connection switch from OFF when a voltage at the first terminal with respect to a potential of the second terminal increases to a threshold voltage or higher;
   a power supply switch disposed in a power supply path from a DC power source to a load, wherein the processor is configured to instruct the power supply switch to be turned ON or OFF;
   a second diode having a cathode connected to a connection node between the power supply switch and the load; and
   a second connection switch connected between an anode of the second diode and the second terminal, wherein the load includes an inductor; and
   wherein the processor is further configured to:
      instruct the second connection switch to be turned ON when instructing the power supply switch to be turned ON, and
      instruct the second connection switch to be turned OFF when instructing the power supply switch to be turned OFF.

2. The control device according to claim 1, further including:
   a first board on which the processor is disposed; and
   a second board that is different from the first board and on which the power supply switch is disposed.

3. The control device according to claim 1, further including:
   a regulator configured to step down a power source voltage of the DC power source with respect to the voltage of the first terminal to a target voltage, and to apply the target voltage to the processor,
   wherein the switching circuit is configured to turn ON the connection switch from OFF with the power source voltage being the target voltage or higher.

4. The control device according to claim 1, further including:
   a resistor having one end connected to the second terminal, wherein the connection switch includes a control terminal, the other end of the resistor is connected to the control terminal of the connection switch, the connection switch is turned ON from OFF when a voltage at the control terminal with respect to the potential of the second terminal increases to a predetermined voltage or higher, the switching circuit includes a circuit switch having an input terminal to which a current is input and an output terminal from which a current is output, the output terminal of the circuit switch is connected to the control terminal of the connection switch, a circuit voltage is applied to the input terminal of the circuit switch, and the circuit switch is turned ON from OFF when the voltage at the first terminal with respect to the potential of the second terminal increases to the threshold voltage or higher.

5. The control device according to claim 4, wherein the circuit switch includes a second control terminal, the circuit switch is ON when a voltage at the second control terminal with respect to the potential of the input terminal is a second predetermined voltage or lower, the switching circuit includes:

a circuit resistor connected between the input terminal and the second control terminal of the circuit switch; and a second circuit switch connected between the second control terminal of the circuit switch and the second terminal, and the second circuit switch is turned ON from OFF when the voltage at the first terminal with respect to the potential of the second terminal increases to the threshold voltage or higher.

6. The control device according to claim 1, further including:

a voltage detection circuit configured to detect a power source voltage of the DC power source with respect to a potential of the first terminal, wherein the switching circuit is configured to turn ON the connection switch from OFF when the voltage at the first terminal with respect to the potential of the second terminal increases to the threshold voltage or higher with the power source voltage detected by the voltage detection circuit being lower than a third predetermined voltage.

7. A control device for a vehicle, comprising:

a processor configured to execute a process;

a first terminal disposed downstream of the processor in a current path through which a current flows through the processor;

a diode having an anode connected to a connection node between the processor and the first terminal;

a connection switch having one end connected to a cathode of the diode;

a second terminal connected to the other end of the connection switch; and a regulator configured to step down a power source voltage of the DC power source with respect to the voltage of the first terminal to a target voltage, and to apply the target voltage to the processor, a switching circuit configured to turn ON the connection switch from OFF when a voltage at the first terminal with respect to a potential of the second terminal increases to a threshold voltage or higher, and wherein the switching circuit is further configured to turn ON the connection switch from OFF with the power source voltage being the target voltage or higher.

8. A control device for a vehicle, comprising:

a processor configured to execute a process;

a first terminal disposed downstream of the processor in a current path through which a current flows through the processor;

a diode having an anode connected to a connection node between the processor and the first terminal;

a connection switch having one end connected to a cathode of the diode;

a second terminal connected to the other end of the connection switch;

a switching circuit configured to turn ON the connection switch from OFF when a voltage at the first terminal with respect to a potential of the second terminal increases to a threshold voltage or higher, and wherein the circuit switch is turned ON from OFF when the voltage at the first terminal with respect to the potential of the second terminal increases to the threshold voltage or higher;

a resistor having one end connected to the second terminal, wherein the connection switch includes a control terminal, the other end of the resistor is connected to the control terminal of the connection switch, the connection switch is turned ON from OFF when a voltage at the control terminal with respect to the potential of the second terminal increases to a predetermined voltage or higher, the switching circuit includes a circuit switch having an input terminal to which a current is input and an output terminal from which a current is output, the output terminal of the circuit switch is connected to the control terminal of the connection switch, a circuit voltage is applied to the input terminal of the circuit switch, and the circuit switch is turned ON from OFF when the voltage at the first terminal with respect to the potential of the second terminal increases to the threshold voltage or higher.

\* \* \* \* \*